United States Patent [19]

Van Rompuy

[11] Patent Number: 5,268,253
[45] Date of Patent: Dec. 7, 1993

[54] LITHOGRAPHIC PRINTING PLATE ACCORDING TO THE SILVER SALT DIFFUSION TRANSFER PROCESS

[75] Inventor: Ludo Van Rompuy, Destelbergen, Belgium

[73] Assignee: Agfa-Gevaert, N.V., Mortsel, Belgium

[21] Appl. No.: 10,004

[22] Filed: Jan. 27, 1993

[30] Foreign Application Priority Data

Feb. 19, 1992 [EP] European Pat. Off. ........ 92200476.7

[51] Int. Cl.$^5$ ................................. G03C 5/54
[52] U.S. Cl. .................... 430/204; 430/244; 430/246; 430/248; 430/233; 430/249; 430/251
[58] Field of Search ............... 430/204, 246, 244, 249, 430/251, 416, 413, 248, 233

[56] References Cited

U.S. PATENT DOCUMENTS

| | | | |
|---|---|---|---|
| 4,683,189 | 7/1987 | Idota et al. | 430/248 |
| 4,803,146 | 2/1989 | Inoue et al. | 430/249 |
| 5,200,294 | 4/1993 | Dekeyzer et al. | 430/251 |

OTHER PUBLICATIONS

Chem. Abstr. 117:140709x, 1992; Abstr. of EP 481,562.

Primary Examiner—Richard L. Schilling
Attorney, Agent, or Firm—Breiner & Breiner

[57] ABSTRACT

The present invention provides a method for making a lithographic printing plate according to the DTR-process comprising the steps of:

information-wise exposing an imaging element comprising on a support in the order given a photosensitive layer containing a silver halide emulsion and a layer containing physical development nuclei;

developing said information-wise exposed imaging element in the presence of developing agent(s) and silver halide solvent(s)

characterized in that said silver halide emulsion comprises said silver halide in an amount of at least 2 g/m$^2$ (expressed as AgNO$_3$), said development is carried out in the presence of a physical development restraining compound and wherein imaging elements comprising a positive working silver halide emulsion of the internal latent image type are excluded. Lithographic printing plates with substantially improved printing endurance are obtained.

9 Claims, No Drawings

LITHOGRAPHIC PRINTING PLATE ACCORDING TO THE SILVER SALT DIFFUSION TRANSFER PROCESS

DESCRIPTION

1. Field of the Invention

The present invention relates to a method for making a lithographic printing plate according to the silver salt diffusion transfer process.

2. Background of the invention

The principles of the silver complex diffusion transfer reversal process, hereinafter called DTR-process, have been described e.g. in U.S. Pat. No. 2,352,014 and the book "Photographic Silver Halide Diffusion Processes" by André Rott and Edith Weyde—The Focal Press—London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

Both positive and negative working DTR-based lithographic printing plates are known. By the term negative working is meant that the silver formed in the image receiving layer and thus the printing areas correspond to the image values in the original while the term positive working means that the printing areas correspond to the non-image values. To obtain a negative working DTR-base printing plate use may be made of a positive working silver halide emulsion i.e. an emulsion that forms an image corresponding to the image values of the original.

To obtain good lithographic properties especially with a mono-sheet imaging element it is important that a strong wear resistant silver image is formed in the image receiving layer to obtain a high printing endurance and that the precipitation of silver in the non-printing areas is kept as low as possible to avoid toning or staining of the plate i.e. inkt acceptance in the non-image areas. It is thus also important that the silver image to be used for printing is of high contrast and sharpness.

SUMMARY OF THE INVENTION

It is an object of the present invention to provide a lithographic printing plate according to the DTR-process of excellent printing properties especially of high printing endurance.

Still further objects of the present invention will become clear in the description hereinafter.

According to the present invention there is provided a method for making a lithographic printing plate according to the DTR-process comprising the steps of:

information-wise exposing an imaging element comprising on a support in the order given a photosensitive layer containing a silver halide emulsion and a layer containing physical development nuclei;

developing said information-wise exposed imaging element in the presence of developing agent(s) and silver halide solvent(s) characterized in that said silver halide emulsion comprises silver halide in an amount of at least 2 g/m$^2$ (expressed as AgNO$_3$), said development is carried out in the presence of a physical development restraining compound and wherein imaging elements comprising a positive working silver halide emulsion of the internal latent image type are excluded.

DETAILED DESCRIPTION OF THE INVENTION

When the method of the present invention for preparing lithographic printing plates according to the DTR-process from imaging elements comprising on a support in the order given a photosensitive layer containing a silver halide emulsion and a layer containing physical development nuclei is applied a substantial increase of the printing endurance was noticed. Normally the printing endurance of printing plates i.e. the number of copies obtainable from one plate, prepared according to the DTR-process from said imaging elements is typically around 10000 while printing plates obtained with the method of the present invention can yield more than 35000 copies.

In the European patent application no. 0 481 562 owned by the present applicant the use of physical development restraining compounds is disclosed for preparing negative working lithographic printing plates according to the DTR-process using an imaging element comprising a positive working silver halide emulsion. To avoid conflict with the aforementioned European patent application under Art. 54(3) of the European Patent Convention such type of imaging elements are excluded in the present invention. It was however not realized that these negative working printing plates could yield high printing endurances. This became only apparent after a continued and extensive research for improving the printing endurance of printing plates obtained according to the DTR-process. Furthermore, it was found that the increased printing endurance is not limited to the negative working printing plates disclosed in the aforementioned European application but is equally well obtained with positive working printing plates comprising a negative working silver halide emulsion.

Physical development restraining compounds (hereinafter also called restraining compounds) according to the present invention are compounds that restrain or even inhibit the physical development of the silver complex to silver in the presence of physical development nuclei and may thus retard or inhibit the formation of a DTR-image in the image receiving layer. Whether a compound is suitable for use as a restraining compound can be determined by the following test.

According to this test a mono-sheet DTR imaging element is prepared by coating in the order given a polyester film support with a layer containing a silver chlorobromide emulsion (98 mol% AgCl) in an amount of 1.5g/m² (expressed as AgNO₃) and a layer containing PdS as physical development nuclei. The silver halide is chemically sensitized spectrally sensitized with an ortho sensitizer and the average grain size of the silver halide is 0.38 μm. The silver halide emulsion further contained hydroquinone and 1-phenyl-4,4'-dimethyl-3-pyrazolidone as developing agents. The thus obtained imaging element is image-wise exposed and developed using the following solution to which is added the compound to be tested in an amount of 0.002 mol/l:

| sodium hydroxide (g) | 30 |
|---|---|
| sodium sulphite anh. (g) | 33 |
| KSCN (g) | 20 |
| 2-mercapto-5-n.heptyl-oxa-3,4-diazole (g) | 0.2 |
| water to make | 1 l |

The thus obtained element is subsequently guided through a neutralization solution having the following composition:

| citric acid | 10 g |
|---|---|
| cysteine | 1 g |
| sodium citrate | 35 g |
| sodium sulphite anh. | 5 g |
| phenol | 50 mg |
| water to make | 1 l |

The thus obtained imaged element is then mounted on an offset press operating with a conventional fountain solution and ink. When less than 100 copies of acceptable quality are obtained under these test conditions because no or only a poor DTR-image is formed in the image receiving layer the compound added to the developing solution is useful as a restraining compound according to the invention.

Preferably used restraining compounds in accordance with the present invention correspond to formula (I) or (II):

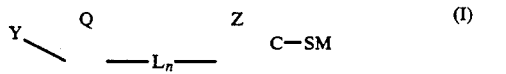
(I)

wherein Y represents a water solubilizing group that increases the water solubility of the compound e.g. a carboxyl group, a sulpho group, sulphonate group, carbonate group, ammonium group etc., Q represents the necessary atoms for forming an aromatic ring optionally substituted with one or more substituents, L represents an organic divalent linking group e.g. alkylene, arylene, an amine, an amide, an ester etc., Z represents a group of atoms to complete a heterocyclic ring including fused rings, M represents hydrogen, a metal cation or an ammonium group and n represents 0 or 1

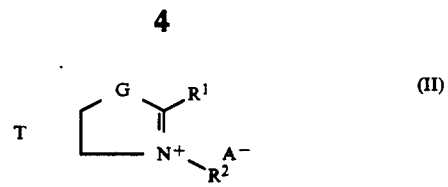
(II)

wherein T represents the necessary atoms for completing an aromatic ring, R¹ and R² each independently represents hydrogen an alkyl, aryl or aralkyl each of which may be substituted and R¹ and R² may also be linked to each other to form a ring. G represents O or S and A represents an anion e.g. toluene sulfonate, Cl⁻, Br⁻, I⁻, ClO₄⁻ etc.

Examples of restraining compounds suitable for use in accordance with the present invention are:

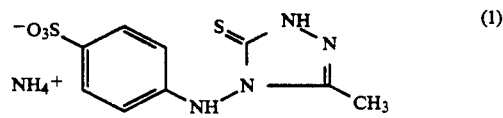
(1)

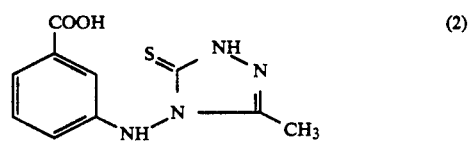
(2)

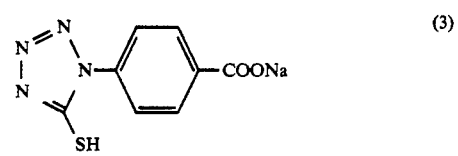
(3)

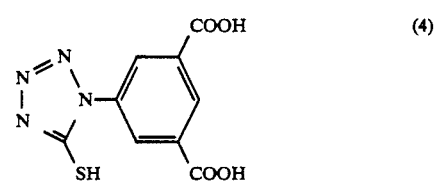
(4)

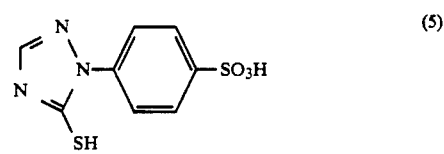
(5)

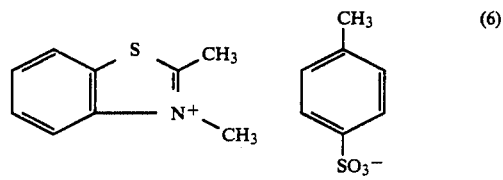
(6)

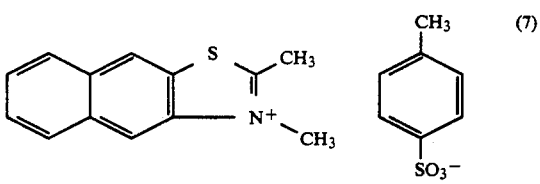
(7)

Most preferably the restraining compounds used in connection with the present invention are present in an alkaline processing liquid used for developing the information-wise exposed imaging element. The total concentration of the restraining compounds in the processing liquid is preferably between 0.001 mol% and 1 mol% of the total amount of silver halide complexing agent(s) that are preferably present in the alkaline processing liquid, more preferably between 0.01 mol% and 0.5 mol% and most preferably between 0.05 mol% and 0.35 mol%. However at least a part of the restraining compounds may be present in one or more layers comprised in the imaging element.

Preferably used silver halide solvents are water soluble thiosulphate compounds such as ammonium and sodium thiosulphate, or ammonium and alkali metal thiocyanates. Other useful silver halide solvents (or "complexing agents") are described in the book "The Theory of the Photographic Process" edited by T. H. James, 4th edition, p. 474-475 (1977), in particular sulphites and uracil. Further interesting silver halide complexing agents are cyclic imides, preferably combined with alkanolamines, as described in U.S. Pat. No. 4,297,430 and U.S. Pat. No. 4,355,090. 2-mercaptobenzoic acid derivatives are described as silver halide solvents in U.S. Pat. No. 4,297,429, preferably combined with alkanolamines or with cyclic imides and alkanolamines. Dialkylmethylenedisulfones can also be used as silver halide solvent.

The total amount of silver halide solvent in the alkaline processing liquid is preferably between 0.5% and 15% by weight, more preferably between 1% and 10% by weight and most preferably between 3% and 8% by weight.

Although the silver halide solvent(s) is preferably present in the processing solution it may also be partially present in one or more layers comprised on the support of the imaging element. When a silver halide solvent is incorporated in the imaging element it may be incorporated as a silver halide solvent precursor as disclosed in e.g. Japanese published unexamined patent applications no. 15247/59 and 271345/63, U.S. Pat. No. 4,693,955 and U.S. Pat. No. 3,685,991.

The alkaline processing liquid used in accordance with the present invention preferably has a pH between 9 and 13. The pH of the alkaline processing liquid may be established using various alkaline substances. Suitable alkaline substances are inorganic alkali e.g. sodium hydroxide, potassium carbonate or alkanolamines or mixtures thereof. Preferably used alkanolamines are tertiary alkanolamines e.g. those described in EP-A-397925, EP-A-397926, EP-A-397927, EP-A-398435 and U.S. Pat. No. 4,632,896. A combination of alkanolamines having both a $pk_a$ above or below 9 or a combination of alkanolamines whereof at least one has a $pk_a$ above 9 and another having a $pk_a$ of 9 or less may also be used as disclosed in the Japanese patent applications laid open to the public numbers 73949/61, 73953/61, 169841/61, 212670/60, 73950/61, 73952/61, 102644/61, 226647/63, 229453/63, U.S. Pat. No. 4,362,811, U.S. Pat. No. 4,568,634 etc. The concentration of these alkanolamines is preferably from 0.1 mol/l to 0.9 mol/l.

The alkaline processing liquid may also contain the developing agent(s) used in accordance with the present invention or alternatively at least part of the developing agent(s) can be present in the imaging element. In case the developing agent or a mixture of developing agents is contained in the imaging element, the processing solution can be merely an aqueous alkaline solution that initiates and activates the development.

Suitable developing agents for the exposed silver halide are e.g. hydroquinone-type and 1-phenyl-3-pyrazolidone-type developing agents as well as p-monomethylaminophenol and derivatives thereof. Preferably used is a combination of a hydroquinone-type and 1-phenyl-3-pyrazolidone-type developing agent wherein the latter is preferably incorporated in one of the layers comprised on the support of the photographic material. Other type of developing agents suitable for use in accordance with the present invention are reductones e.g. ascorbic acid derivatives. Such type of developing agents are disclosed in the unpublished European patent application number 0 498 968.

The alkaline processing liquid preferably also contains so-called hydrophobizing agents that increase the hydrophobicity of the silver formed in the image-receiving layer. Generally these compounds contain a mercapto group or thiolate group and one or more hydrophobic substituents e.g. an alkyl containing at least 3 carbon atoms. Examples of hydrophobizing agents are e.g. those described in U.S. Pat. No. 3,776.728, and U.S. Pat. No. 4.563,410.

According to the present invention the hydrophobizing agents are preferably contained in the alkaline processing liquid in an amount of at least 0.1 g/l, more preferably at least 0.2 g/l and most preferably at least, 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The processing solution for use in accordance with the present invention may comprise other additives such as e.g. thickeners, preservatives, detergents e.g. acetylenic detergents such as surfynol 104, surfynol 465, surfynol 440 etc. all available from Air Reduction Chemical Company New York.

According to a preferred embodiment of the present invention the processing of an information-wise exposed imaging element is carried out using two processing liquids of which only the second processing liquid that is applied contains a silver halide solvent and the restraining compound(s).

The DTR-process is normally carried out at a temperature in the range of 10° C. to 35° C.

The above described development step(s) is preferably followed by a neutralization of the surface of the imaged element by guiding the element through a neutralization liquid having a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

The photographic silver halide emulsion used in the photosensitive layer of the imaging element in accordance with the present invention can be prepared from soluble silver salts and soluble halides according to different methods as described e.g. by P. Glafkides in "Chimie et Physique Photographique", Paul Montel, Paris (1967). by G. F. Duffin in "Photographic Emulsion Chemistry", The Focal Press, London (1966). and by V. L. Zelikman et al in "Making and Coating Photographic Emulsion". The Focal Press, London (1966).

The photographic silver halide emulsion used according to the present invention can be prepared by mixing the halide and silver solutions in partially or fully controlled conditions of temperature, concentrations, sequence of addition, and rates of addition. The silver halide can be precipitated according to the single-jet method or the double-jet method. The silver halide particles of the photographic emulsion used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

The silver halide emulsion according to the present invention is preferaby a silver chloride, silver chlorobromide or silver bromide emulsion. These emulsions may also contain a small amount of silver iodide upto 3 mole%.

The average size of the silver halide grains may range from 0.10 to 0.70 $\mu m$, preferably from 0.25 to 0.45 $\mu m$.

The size distribution of the silver halide particles of the photographic emulsion to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AGNO_3$, preferably between $10^{-7}$ and $10^{-6}$ mole per mole of $AGNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The silver halide emulsion can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65-72 (1951). The spectral photosensitivity of the silver halide can be adjusted by proper spectral sensitization by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. HAMER in "The Cyanine Dyes and Related Compounds" (1964) Interscience Publishers, John Wiley & Sons, New York. The silver halide emulsion may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable Stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2-27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsion may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217, and GB-P 1,907,440.

Preferably the emulsion layer contained in the imaging element contains a compound which comprises in its molecular structure a group capable of adsorbing to silver halide and a group capable of reducing silver halide. Compounds of this kind have been disclosed in the European Patent Application No 449340. In this way a combination of a stabilizing and a development activating function in one compound is achieved.

Apart from negative working silver halide emulsions positive working silver halide emulsions can be used in connection with the present invention. Especially preferred positive working silver halide emulsions are those disclosed in the European patent application no.0 481 562.

It is essential to the present invention that the silver halide emulsion is coated in an amount of silver expressed as $AgNO_3$ of at least 2 g/m$^2$, more preferably of at least 2.5 g/m$^2$ and most preferably of at least 3 g/m$^2$. It has been found that the printing endurance is further increased by increasing the amount of silver coated per square meter. The maximum amount of silver coated is in principal not limited but will be determined by the practical conditions. The optimum amount of silver can be easily found using routine experimentation.

The amount of hydrophilic colloid contained in the photosensitive layer containing silver halide is preferably kept between 1.5 g/m$^2$ and 7 g/m$^2$ and more preferably between 3 g/m$^2$ and 5 g/m$^2$. More details about the composition, preparation and coating of silver halide emulsions can be found in e.g. Product Licensing Index, Vol. 92, December 1971, publication 9232, p. 107-109.

The layer containing physical development nuclei is preferably free of hydrophilic binder but may comprise small amounts upto 30% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

In addition to the above described emulsion layer and physical development nuclei layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer ; as alternative finely divided carbon black can be used for the same antihalation purposes as described in U.S. Pat. No. 2,327,828. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants. antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl -2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type. described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports such as e.g. aluminium, zinc, steel etc., may also be used in accordance with the photographic element of the present invention.

The present invention is illustrated by the following examples without however limiting it thereto. All parts are by weight unless otherwise specified.

EXAMPLE 1

A gelatino silver chlorobromoiodide emulsion is prepared by conversion of a silver chlorobromide emulsion containing 19 mol% of silver bromide by very slowly adding to 1 kg of said emulsion whilst stirring 90 ml of a 35% aqueous potassium bromide solution in 15 min. Said emulsion is physically ripened for 1 hour at 40° C. and 100 ml of a solution containing 34% of potassium bromide and 1% potassium iodide is subsequently added. Said emulsion is subsequently cooled and washed. By heating the washed emulsion, a liquid silver chlorobromoiodide emulsion, is obtained containing 96 mol% of bromide and 0.5 mol% of iodide.

The thus prepared silver chlorobromoiodide emulsion is coated in an amount equivalent to 5 g/m$^2$ of silver nitrate and an amount of 4.5 g/m$^2$ of gelatin onto a polyethyleneterephthalate film support (coated with a hydrophilic adhesion layer).

The emulsion layer is overcoated with a layer of physical development nuclei being palladium sulphide nuclei.

The thus obtained imaging element was image-wise exposed during 1 μs using a Xenon flash. The distance between said imaging element and the Xenon flash was 58 cm. The intensity of the Xenon flash was 13.8 J/cm$^2$.

The thus obtained image-wise exposed imaging element was processed for 20 s in a developer of the following composition:

| | |
|---|---|
| N-methyl-p-hydroxy-aniline | 30 g |
| sodium sulphite | 110 g |
| sodium hydroxide | 23 g |
| N-methylaminoethanol | 40 ml |
| EDTA | 1 g |
| sodium carbonate | 40 g |
| hydroquinone | 24 g |
| sodium bromide | 5 g |
| oxalic acid | 2 g |
| water to make | 1000 ml |

After rinsing, said imaging element was processed for 15 s in a transfer developing solution of the following solution:

| | |
|---|---|
| sodium hydroxide | 30 g |
| sodium sulphite | 33 g |
| EDTA | 1 g |
| potassium thiocyanate | 80 g |
| 5-n-heptyl-2-mercapto-1,3,4-oxadiazol | 0.15 g |
| hydroquinone | 13 g |
| 1-phenyl-4,4-dimethyl-3-pyrazolidone | 4.7 g |
| compound 1 | 0.7 g |
| water to make | 1000 ml |

After rinsing said imaging element a lithographic printing plate was obtained. Said printing plate was wiped with a starter solution G540b commercially available from AGFA-GEVAERT N. V. and mounted on an offset press. More than 30000 copies of excellent quality could be printed using a conventional fountain solution and lithographic ink.

EXAMPLE 2

A silver chlorobromoiodide emulsion was prepared by the double jet precipitation technique. The silver halide emulsion contained 98 mol% of AgCl, 1.8 mol% of AgBr and 0.2 mol% of AgI and was doped with 2.5 10$^{-7}$ mol of rhodium (III) per mol of silver. The emulsion was physically ripened for half an hour at 65° C. and thereafter a surface conversion with silver iodide was carried out to a obtain the final amount of 0.2 mol% of AgI. The emulsion was then chemically ripened with gold and thiosulphate.

The thus obtained silver halide emulsion was used to prepare 4 different imaging elements by coating 4 polyethyleneterephtalate supports (coated with a hydrophilic adhesion layer) with respectively 5, 3, 1 and 0.5g/m$^2$ of silver halide (expressed as AgNO$_3$) and 4.52 g/m$^2$ of gelatin. The thus obtained elements were allowed to dry and then coated with a layer containing PdS nuclei.

Each of the 4 imaging elements was image-wise exposed with a 50W light halogen light source for 5s and subsequently processed using the following developing solution:

| | |
|---|---|
| hydroquinone | 13 g |
| 1-phenyl-4,4-dimethyl-3-pyrazolidone | 4.7 g |
| NaOH | 25 g |
| Na$_2$SO$_3$ | 40 g |
| KSCN | 110 g |
| 3-mercapto-4-acetamido-5-n.heptyl-1,2,4-triazole | 0.5 g |
| compound 1 (see above) | 0.7 g |
| water to make | 1 liter |

The thus developed imaging elements were then guided through a neutralization solution having the following composition:

| | |
|---|---|
| citric acid | 10 g |
| cysteine | 1 g |
| sodium citrate | 35 g |
| sodium sulphite anh. | 5 g |
| phenol | 50 mg |
| water to make | 1 l |

Subsequently the obtained plates were treated with a G540 starter solution (commercially available from Agfa-Gevaert N. V.) and printed on a HeidelBerg GTO 46 printing machine using K+E 123W ink and a commonly used fountain solution.

The printing results were as follows:

| amount of AgNO$_3$ in the imaging element (g/m$^2$) | printing endurance |
|---|---|
| 5 | >30000 |
| 3 | >30000 |
| 1 | 0 |
| 0.5 | 0 |

EXAMPLE 3

(comparative)

An imaging element was prepared as described in example 1 and subsequently information-wise exposed and processed as in example 1 with the difference however that in the transfer developer the restraining compound 1 was omitted. The thus obtained printing plate was used to print as described in example 1. Less than 1000 copies of good quality could be obtained.

EXAMPLE 4

(comparitive)

A DTR monosheet material was prepared as follows. One side of a transparent polyethyleneterephtalate support was coated with a pack of two backing layers, the other side was coated with an antihalation layer and an emulsion layer. After drying these layers were subjected to a temperature of 40° C. for 5 days and then the emulsion layer was overcoated with a layer containing development nuclei.

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP 0080225, 0.05 g/m² of hardening agent triacrylformal and 0.021 g/m² of wetting agent $F_{15}C_7$—COONH$_4$.

The antihalation layer contained 0.1 g/m² of carbon black, 3 g/m² of gelatin and 0.8 g/m² of silica particles of 5 micron average diameter.

The emulsion was a typical chlorobromide emulsion composed of 98.2 % of chloride and 1.8 % of bromide, having an average grain size of 0.4 micron and containing Rhodium ions as internal dopant. The emulsion was orthochromatically sensitized.

The emulsion layer contained 1.5 g/m² of silver halide expressed as AGNO$_3$, 1.5 g/m² of gelatin, 0.15 g/m² of 1-phenyl-4,4'-dimethyl-3-pyrazolidinone and 0.25 g/m² of hydroquinone.

The thus prepared DTR-material was image-wise exposed and processed with an activator solution having the composition shown below and subsequently neutralized at 25° C. with the neutralization solution also shown below. The thus obtained lithographic printing plates were used to print as described in example 1 and yielded about 10000 copies of good quality.

| Activator solution: | |
| --- | --- |
| sodium hydroxide (g) | 30 |
| sodium sulphite anh. (g) | 33 |
| potassium thiocyanate (g) | 20 |
| 3-mercapto-4-acetamido-5-n.heptyl-1,2,4-triazole (g) | 0.15 |
| water to make | 1 l |
| Neutralization solution: | |
| citric acid | 10 g |
| sodium citrate | 35 g |
| cysteine | 1 g |
| sodium sulphite anh. | 5 g |
| phenol | 50 mg |
| water to make | 1 l |

I claim:

1. A method for making a lithographic printing plate according to the DTR-process comprising the steps of:
   information-wise exposing an imaging element comprising on a support in the order given a photosensitive layer containing a silver halide emulsion and a layer containing physical development nuclei;
   developing said information-wise exposed imaging element in the presence of developing agent(s) and silver halide solvent(s)
   characterized in that said silver halide emulsion comprises silver halide in an amount of at least 2 g/m² (expressed as AGNO$_3$), said development is carried out in the presence of a physical development restraining compound and wherein imaging elements comprising a positive working silver halide emulsion of the internal latent image type are excluded.

2. A method according to claim 1 wherein said restraining compound corresponds to formula (I) or (II):

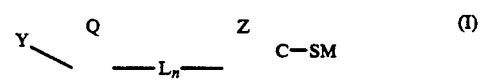

wherein Y represents a water solubilizing group that increases the water solubility of the compound, Q represents the necessary atoms for forming an aromatic ring optionally substituted with one or more substituents, L represents an organic divalent linking group, Z represents a group of atoms to complete a heterocyclic ring including fused rings, M represents hydrogen, a metal cation or an ammonium group and n represents 0 or 1

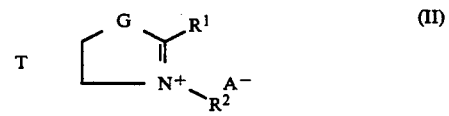

wherein T represents the necessary atoms for completing an aromatic ring, R$^1$ and R$^2$ each independently represents hydrogen an alkyl, aryl or aralkyl each of which may be substituted and R$^1$ and R$^2$ may also be linked to each other to form a ring, G represents 0 or S and A represents an anion.

3. A method according to claim 2 wherein said water solubilizing group is a carboxyl group, carboxylate group, sulpho group or sulphonate group.

4. A method according to claim 1 wherein said silver halide is comprised in said imaging element in an amount of at least 2.5 g/m² expressed as AgNO$_3$.

5. A method according to claim 1 wherein said restraining compound(s) is present in an alkaline processing liquid comprising a silver halide solvent and used for developing said information-wise exposed imaging element in an amount of 0.001 mole% to 1 mole% of the amount of silver halide solvent in said processing liquid.

6. A method according to claim 5 wherein said amount of said restraining compound is between 0.01 mole% and 0.5 mole% of said silver halide solvent.

7. A method according to claim 5 wherein the amount silver halide solvent is between 0.5% and 15% by weight.

8. A method according to claim 7 wherein the amount of said silver halide solvent is between 1% and 10% by weight.

9. A method according to claim 1 wherein said development of said information-wise exposed imaging element is carried out using two alkaline processing liquids of which only the second liquid applied comprises a silver halide solvent.

* * * * *